(12) United States Patent
Lecat-Mathieu De Boissac et al.

(10) Patent No.: US 10,771,048 B2
(45) Date of Patent: Sep. 8, 2020

(54) MEASUREMENT OF THE DURATION OF A PULSE

(71) Applicants: STMicroelectronics (Crolles 2) SAS, Crolles (FR); STMicroelectronics SA, Montrouge (FR)

(72) Inventors: Capucine Lecat-Mathieu De Boissac, Grenoble (FR); Fady Abouzeid, La Terrasse (FR); Gilles Gasiot, Seyssinet-Pariset (FR); Philippe Roche, Biviers (FR); Victor Malherbe, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 16/747,341

(22) Filed: Jan. 20, 2020

(65) Prior Publication Data
US 2020/0252059 A1    Aug. 6, 2020

(30) Foreign Application Priority Data

Jan. 31, 2019 (FR) ..................................... 19 00935

(51) Int. Cl.
| | |
|---|---|
| *H03K 5/14* | (2014.01) |
| *H03K 5/135* | (2006.01) |
| *H03K 5/00* | (2006.01) |

(52) U.S. Cl.
CPC ............. *H03K 5/14* (2013.01); *H03K 5/135* (2013.01); *H03K 2005/00176* (2013.01); *H03K 2005/00273* (2013.01)

(58) Field of Classification Search
CPC .......... H03K 5/13; H03K 5/131; H03K 5/133; H03K 5/134; H03K 5/135; H03K 5/14

USPC .............................................. 327/31, 37, 38
See application file for complete search history.

(56) References Cited

U.S. PATENT DOCUMENTS

| | | | | |
|---|---|---|---|---|
| 2002/0175730 A1* | 11/2002 | DeRyckere | ............ | H03K 5/135 327/277 |
| 2009/0112499 A1* | 4/2009 | Chao | ................ | G01R 31/31709 702/69 |
| 2009/0141595 A1* | 6/2009 | Huang | .................. | G04F 10/005 368/118 |
| 2009/0322574 A1* | 12/2009 | Rivoir | ................... | G04F 10/005 341/120 |

(Continued)

FOREIGN PATENT DOCUMENTS

| | | |
|---|---|---|
| EP | 1961122 A0 | 8/2007 |
| JP | 2011259208 A | 12/2011 |

OTHER PUBLICATIONS

Detailed SET Measurement and Characterization of a 65nm Bulk Technology; Maximilien Glorieux et al.; IEEE Transaction on Nuclear Science, vol. 64, No. 1, Jan. 2017, pp. 81-88.

(Continued)

*Primary Examiner* — Tomi Skibinski
(74) *Attorney, Agent, or Firm* — Crowe & Dunlevy

(57) ABSTRACT

A first circuit includes a first chain of identical stages defining first and second delay lines. A second circuit includes a second chain of identical stages defining third and fourth delay lines. The stages of the second chain are identical to the stages of the first chain. A third circuit selectively couples one of the third delay line, the fourth delay line, or a first input of the third circuit to an input of the first circuit.

20 Claims, 6 Drawing Sheets

(56) References Cited

U.S. PATENT DOCUMENTS

2010/0171529 A1* 7/2010 Chatterjee ........ G01R 31/31709
327/31
2015/0212494 A1* 7/2015 Waltari ................ G04F 10/005
341/166

OTHER PUBLICATIONS

Henzler S et al: "A Local Passive Time Interpolation Concept for Variation—Tolerant High-Resolution Time-to-Digital Conversion", IEEE Journal of Solid-State Circuits, IEEE Service Center, Piscataway, NJ, USA, vol. 40, No. 7, Jul. 1, 2008 (Jul. 1, 2008), pp. 1666-1676, XP011229237, ISSN: 0018-9200 * le document en entier *.

Kauppila J S et al: "Exploiting Parallelism and Heterogeneity in a Radiation Effects Test Vehicle for Efficient Single-Event Characterization of Nanoscale Circuits", IEEE Transactions on Nuclear Science, IEEE Service Center, New York, NY, US, vol. 65, No. 1, Jan. 1, 2018 (Jan. 1, 2018), pp. 486-494, XP011675977, ISSN: 0018-9499, DOI: 10.1109/TNS.2017.2783260 [extrait le Jan. 17, 2018] * le document en entier *.

Liu Rui et al: "Analysis of Advanced circuits for SET measurement", 2015 IEEE International Reliability Physics Symposium, IEEE International Reliability Physics Symposium, IEEE, Apr. 19, 2015 (Apr. 19, 2015), XP032780938, DOI: 10.1109/IRPS.2015.7112827 [extrait le May 26, 2015] * le document en entier *.

Liu Rui et al: "Single Event Transient and TID Study in 28 nm UTBB FDSOI Technology", IEEE Transactions on Nuclear Science, IEEE Service Center, New York, NY, US, vol. 64, No. 1, Jan. 1, 2017 ( Jan. 1, 2017), pp. 113-118, XP011642203, ISSN: 0018-9499 , DOI: 10.1109/TNS.2016.2627015 [extrait le Mar. 2, 2017] * le document en entier *.

Veronique Ferlet-Cavrois et al: "Single Event Transients in Digital CMOS A Review ", IEEE Transactions on Nuclear Science, IEEE Service Center, New York, NY, US, vol. 60, No. 3, Jun. 1, 2013 (Jun. 1, 2013), pp. 1767-1790, XP011514554, ISSN: 0018-9499, DOI: 10.1109/TNS.2013.2255624 * le document en entier*.

Yanagawa Y et al: "Direct Measurement of Set Pulse Widths in 0.2-m SOI Logic Cells Irradiated by Heavy Ions", IEEE Transactions on Nuclear Science, IEEE Service Center, New York, NY, US, vol. 53, No. 6 , Dec. 1, 2006 (Dec. 1, 2006), pp. 3575-3578, XP011152284, ISSN: 0018-9499, DOI: 10.1109/TNS.2006.885110 * le document en entier *.

INPI Search Report and Written Opinion for FR 1900935 dated Nov. 14, 2019 (14 pages).

* cited by examiner

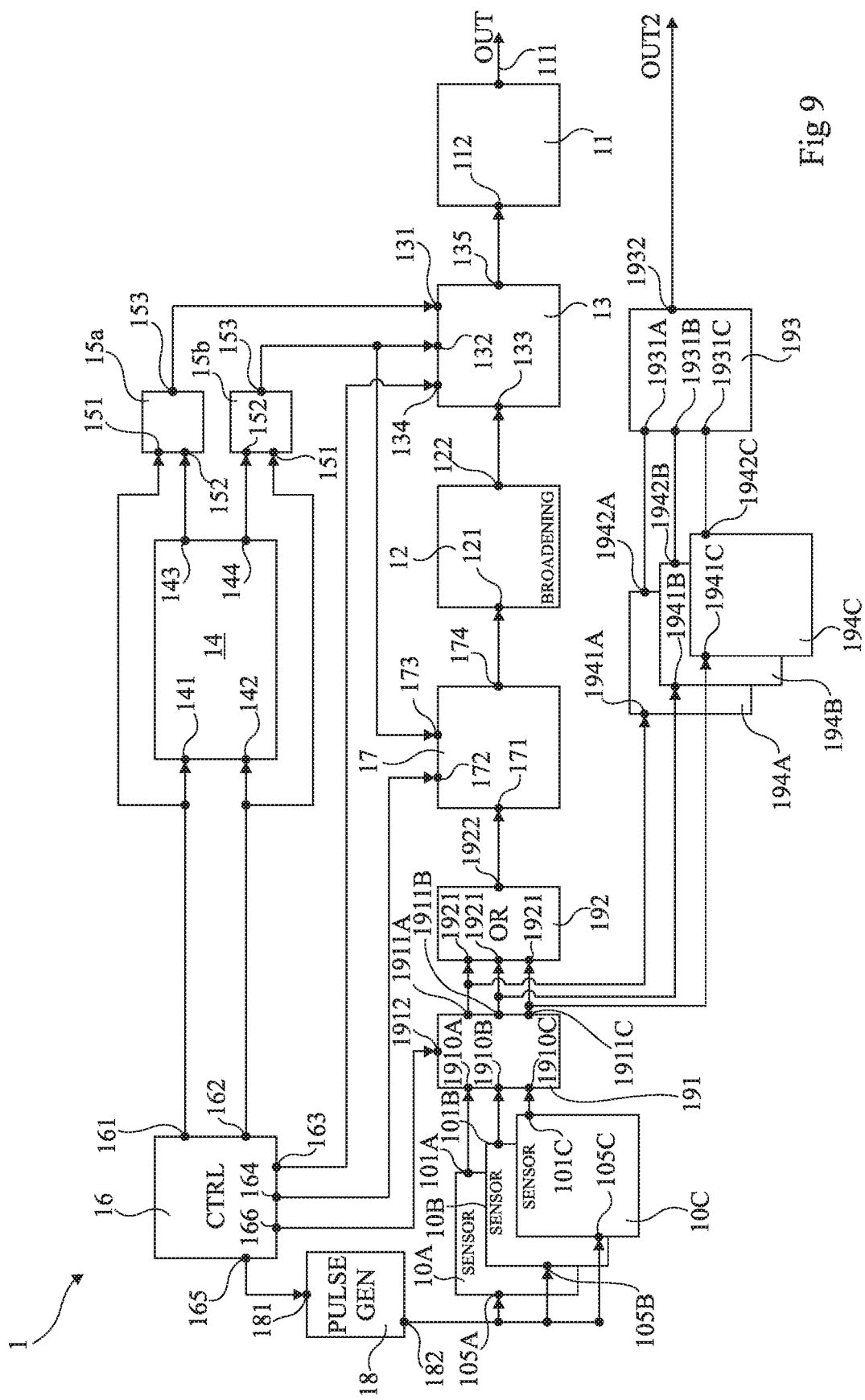

MEASUREMENT OF THE DURATION OF A PULSE

PRIORITY CLAIM

This application claims the priority benefit of French Application for Patent No. 1900935, filed on Jan. 31, 2019, the content of which is hereby incorporated by reference in its entirety to the maximum extent allowable by law.

TECHNICAL FIELD

The present disclosure generally concerns electronic circuits and, in particular, electronic circuits for measuring the duration of a pulse, particularly circuits of detection and characterization of a radiating particle based on the voltage pulse generated by the particle when it hits a combinational logic circuit.

BACKGROUND

Circuits are known in the art for detection and characterization of a radiating particle comprising at least a first combinational logic circuit configured to propagate a pulse generated in the combinational logic circuit when it is hit by a radiating particle, and a second circuit configured to supply a signal representative of the duration of the generated pulse to characterize the particle. Indeed, when a particle hits the first circuit and when it generates therein a transient voltage pulse, generally designated with acronym SET ("Single Event Transient"), the duration of the pulse is representative of characteristics of the particle, for example, of its type and/or of its power.

In such circuits, an error with respect to the measurement of the duration of the pulse may result in an erroneous characterization of the particle.

There is a need in the art to decrease or correct errors in the measurement of the duration of a transient voltage pulse, particularly measurement errors due to manufacturing variations of the circuit performing the measurement.

SUMMARY

An embodiment overcomes all or part of the disadvantages of known circuits for measuring the duration of a voltage pulse, in particular of known circuits of detection and of characterization of a radiating particle.

An embodiment provides a circuit or device for measuring the duration of a voltage pulse enabling to correct measurement errors, particularly due to manufacturing variations.

An embodiment more particularly provides a device for measuring the duration of a voltage pulse delivering output signals from which the error on the measurement of the duration of the pulse is estimated.

Thus, an embodiment provides a device comprising: a first circuit comprising a first chain of identical stages defining first and second delay lines; a second circuit comprising a second chain of stages identical to the stages of the first chain, the second chain defining third and fourth delay lines; and a third circuit selectively coupling the third delay line, the fourth delay line, or a first input of the third circuit to a same input of the first circuit.

According to an embodiment, the number of stages of the second circuit is smaller than the number of stages of the first circuit.

According to an embodiment, the first circuit, preferably a vernier delay line circuit, is configured to deliver an output signal representative of a duration of a pulse received by said same first input of the first circuit.

According to an embodiment, the device further comprises: a fourth circuit connected to the third delay line and configured to deliver to the third circuit a first pulse having a duration representative of the delay introduced by the third delay line; and a fifth circuit connected to the fourth delay line and configured to deliver to the third circuit a second pulse having a duration representative of the delay introduced by the fourth delay line, the third circuit being configured to selectively deliver, to said same input of the first circuit, the first pulse, the second pulse, or a pulse received by the first input of the third circuit, according to a control signal received by a second input of the third circuit.

According to an embodiment, each stage in the first chain introduces a first delay on the first delay line and a second delay on the second delay line, and each stage in the second chain introduces the first delay on the third delay line and the second delay on the fourth delay line, the second delay being longer than the first delay.

According to an embodiment, each stage comprises a synchronous flip-flop; a fourth circuit coupling a first input of the stage to a first output of the stage and to a data input of the synchronous flip-flop, the fourth circuit being configured to propagate a signal with the first delay; and a fifth circuit coupling a second input of the stage to a second output of the stage and to a synchronization input of the synchronous flip-flop, the fifth circuit being configured to propagate a signal with the second delay.

According to an embodiment, the device further comprises a sixth circuit having an output connected to the first input of the third circuit and having an input intended to receive a pulse, the sixth circuit being configured to deliver at its output a pulse longer by a given duration than the pulse received by its input.

According to an embodiment, the device further comprises a seventh circuit configured to selectively deliver, at the input of the sixth circuit, one of the first and second pulses or a pulse received on a first input of the seventh circuit, according to a control signal received by a second input of the seventh circuit.

According to an embodiment, the device further comprises at least one eighth circuit configured to propagate a pulse to an output of the eighth circuit, the output of the eighth circuit being coupled to the first input of the seventh circuit.

According to an embodiment, the device further comprises a ninth circuit having an output coupled to an input of said at least one eighth circuit, the ninth circuit being configured to deliver at its output a same pulse each time an input of the eighth circuit receives a corresponding control signal.

According to an embodiment, the device comprises at least two eighth circuits.

According to an embodiment, the device comprises a tenth circuit configured to selectively couple, according to a control signal received by an input of the tenth circuit, the output of the ninth circuit to the input of one of the eighth circuits; and an eleventh circuit configured to deliver to the first input of the seventh circuit a signal corresponding to the logic OR of the outputs of the eighth circuits.

According to an embodiment, the device comprises a tenth circuit configured to selectively couple, according to a control signal received by an input of the tenth circuit, the outputs of the eighth circuits to corresponding outputs of the tenth circuit or the output of a single one of the eighth circuits to the output of the tenth circuit corresponding to said single one of the eighth circuits; and an eleventh circuit configured to deliver, to the first input of the seventh circuit, a signal corresponding to the logic OR of the outputs of the tenth circuit.

According to an embodiment, the device further comprises a twelfth circuit configured to deliver a signal indicating which of the eighth circuits a pulse received by the first input of the seventh circuit originates from.

According to an embodiment, the device further comprises a control circuit configured to deliver an input signal to the third delay line and to the fourth delay line.

According to an embodiment, the control circuit is further configured to deliver the control signal of the third circuit and/or the control signal of the seventh circuit and/or the control signal of the ninth circuit and/or the control signal of the tenth circuit.

BRIEF DESCRIPTION OF THE DRAWINGS

The foregoing and other features and advantages will be discussed in detail in the following non-limiting description of specific embodiments in connection with the accompanying drawings, wherein:

FIG. 9 schematically shows in the form of blocks still another alternative embodiment of the device of FIG. 1.

DETAILED DESCRIPTION

Figure 1:
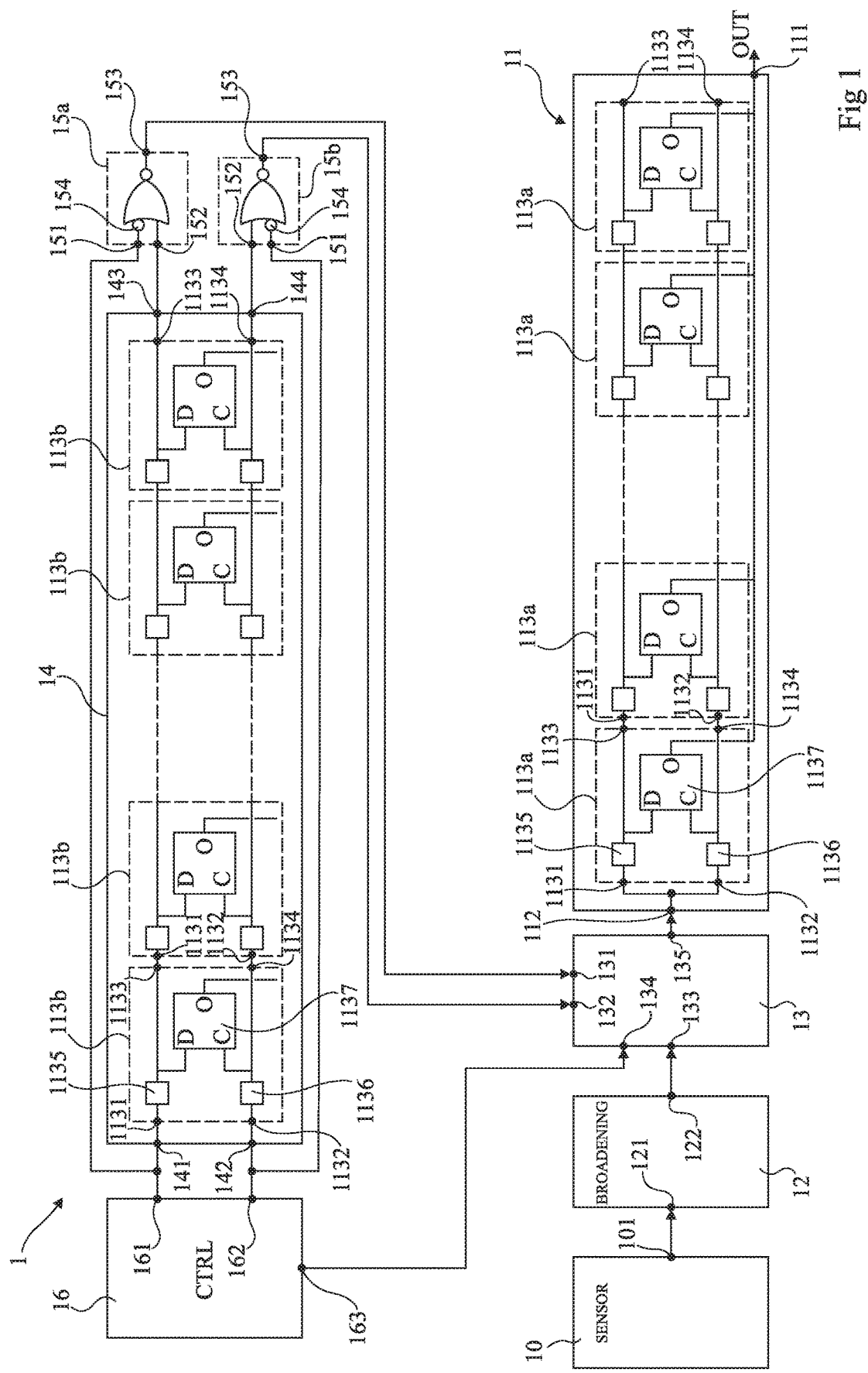
FIG. 1 schematically shows in the form of blocks an embodiment of a device configured to detect and characterize a radiating particle.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the characterization of a particle from the transient voltage pulse that it generates has not been detailed, the described embodiments being compatible with usual characterizations of a particle from the pulse that it generates.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

In the following description, a signal which alternates between a first constant state, for example, a low state, noted "0", and a second constant state, for example, a high state, noted "1", is called "binary signal". The states "1" and "0" of a binary signal correspond to the respective values "1" and "0" of a bit represented by the binary signal. The high and low states of different binary signals of a same electronic circuit may be different. In particular, the binary signals may correspond to voltages which may not be perfectly constant in the high or low state.

FIG. 1 schematically shows in the form of blocks an embodiment of a circuit or device 1 configured to detect and characterize a radiating particle.

Device 1, preferably an integrated circuit, comprises at least one circuit or sensor 10 (SENSOR), a single sensor 10 in the example of FIG. 1. Circuit 10 is a combinational logic circuit configured so that, when a radiating particle hits circuit 10 and generates a transient voltage pulse therein, circuit 10 propagates the pulse, without deforming it, to an output 101 of circuit 10.

Device 1 further comprises a circuit 11. Circuit 11, here a vernier delay line or VDL, is configured to deliver, at the level of an output 111 of circuit 11, a digital signal or binary word OUT representative of the duration of a pulse received by an input 112 of circuit 11. Input 112 of circuit 11 is coupled to output 101 of circuit 10, in this embodiment via two circuits 12 and 13.

Circuit 11 comprises a chain of identical stages or elementary circuits 113a, for example, a chain of 256 stages 113a. The chain of stages 113a is connected between input 112 and output 111 of circuit 11. Each stage 113a comprises two inputs 1131 and 1132, two outputs 1133 and 1134, two circuits 1135 and 1136, and one synchronous flip-flop 1137. The inputs 1131 and 1132 of first stage 113a of the chain (on the left-hand side in FIG. 1) are connected to a same input 112 of circuit 11. The outputs 1133 and 1134 of each stage 113a of the chain, except for those of the last stage 113a (on the right-hand side in FIG. 1) are connected to the respective inputs 1331 and 1132 of the next stage 113a in the chain. In the example of FIG. 1, outputs 1133 and 1134 of the last stage 113a in the chain are not connected or, in other words, are omitted.

In each stage 113a, circuit 1135 is connected between the input 1131 and the output 1133 of the considered stage. The output of circuit 1135 of stage 113a is further connected to an input, here the data input D, of flip-flop 1137 of the stage. The output of circuit 1135 of stage 113a forms output 1133 of the stage. Circuit 1135 is configured to introduce a first delay T1 between input 1131 and output 1133 of the stage, and thus the D input of flip-flop 1137. In other words, when a voltage pulse is supplied to input 1131 of the stage at a time t, the pulse is transferred onto the D input of flip-flop 1137 and onto output 1133 of the next stage in the chain at a time t+T1 (the delay and the duration of the delay are here designated with the same reference T1). The series connection of the circuits 1135 of circuit 11 forms a first delay line of circuit 11. As an example, each circuit 1135 is formed of two inverters series-connected between the input and the output of circuit 1135 or, in other words, between input 1131 and output 1133 of the considered stage.

Similarly, in each stage 113a, circuit 1136 is connected between input 1132 and output 1134 of the considered stage. Output 1134 of the stage, that is, the output of circuit 1136 of this stage, is connected to an input, here, the synchronization input C, of flip-flop 1137 of the stage. Circuit 1136 is configured to introduce a second delay T2, longer than delay T1, between input 1132 and output 1134 of the stage, and thus input C of flip-flop 1137. In other words, when a voltage pulse is supplied to input 1132 of the stage at a time t, the pulse is transferred onto the C input of flip-flop 1137 and onto output 1134 of the stage at a time t+T2 (the delay and the duration of the delay are here designated with the same reference T2). The series connection of circuits 1136 of circuit 11 forms a second delay line of circuit 11, parallel to the first delay line of circuit 11. As an example, each circuit 1136 is formed of two inverters series-connected between the input and the output of circuit 1136 or, in other words, between input 1132 and output 1134 of the considered stage.

Each flip-flop 1137 comprises an output O delivering a binary signal. The assembly of the binary signals supplied by the O outputs of the flip-flops 1137 of circuit 11 or, in other words, the concatenation of the output bits of flip-flops 1137, forms a digital signal, or binary word, representative of the duration of the pulse received by input 112 of circuit 11. In this embodiment, each flip-flop 1137 is configured to store, on each rising edge of the binary signal present on its C input, the high or low state of the binary signal present on its D input, and to maintain the binary signal supplied by its O output at the stored state until the next rising edge on its C input.

In the example of FIG. 1, signal OUT corresponds to the concatenation of the output signals of flip-flops 1137 of circuit 11. As a variation, circuit 11 comprises a circuit supplying signal OUT from all the output signals of flip-flops 1137, so that signal OUT corresponds to a binary word comprising less bits than there are stages 113a in circuits 11.

Circuit 12 (BROADENING) comprises an input 121 and an output 122. Input 121 is coupled, here connected, to output 101 of circuit 10. When it receives a pulse of duration Tpulse on its input 121, circuit 12 is configured to supply, on its output 122, a pulse of duration Tbd+Tpulse, Tbd being a constant duration. In other words, circuit 12 is configured to lengthen by a duration Tbd the duration Tpulse of a pulse that it receives.

In an alternative embodiment, circuit 12 may be omitted. However, omitting circuit 12 generates the risk that, when a transient voltage pulse is generated by a particle reaching circuit 10, the duration thereof is too short to be detected by circuit 11.

Device 1 further comprises a circuit 14 comprising a chain of stages 113b identical to the stages 113a of the chain of circuit 11. Circuit 14 comprises inputs 141 and 142 connected to the respective inputs 1131 and 1132 of the first stage 113b (on the left-hand side in FIG. 1). Outputs 1133 and 1134 of the last stage 113b (on the right-hand side in FIG. 1) are connected to respective outputs 143 and 144 of circuit 14. The number N of stages 113b of the chain of circuit 14 is smaller than the number of stages 113a of the chain of circuit 11. Stages 113b are connected one after the others in the same way as stages 113a. Thus, the series connection of circuits 1135 of circuit 14 forms a first delay line of circuit 14, and the series connection of circuits 1136 of circuit 14 forms a second delay line of circuit 14, parallel to the first delay line of circuit 14. In circuit 14, the outputs O of flip-flops 1137 of stages 113b are not connected or, in other words, are not used to deliver an output signal of circuit 14.

Device 1 comprises two circuits 15a and 15b, preferably identical to each other. Circuit 15a, respectively 15b, comprises an input 151 connected to input 141, respectively 142, of circuit 14, and an input 152 connected to output 143, respectively 144, of circuit 14. In other words, circuit 15a is connected to the end of the first delay line of circuit 14, circuit 15b being connected to the ends of the second delay line of circuit 14. Each circuit 15a, 15b comprises an output 153. Each circuit 15a, 15b is configured to deliver a pulse having a duration corresponding to the delay introduced by the delay line of the circuit 14 to which it is connected. More particularly, in this example, each circuit 15a, 15b is configured to deliver a binary output signal in the high state only if the signals received by its inputs 151 and 152 are respectively in the high state and in the low state. In the example of FIG. 1, each circuit 15a, 15b comprises a NOR gate having a first input receiving the inverse or the complement (inverter 154) of the signal received by the input 151 of circuit 15a, respectively 15b, having a second input receiving the signal received by the input 152 of circuit 15a, respectively 15b, and having its output delivering the output signal of circuit 15a, respectively 15b. It will, however, be understood that use of NOR gate technology for the circuits 15a, 15b is just by example and that suitable logic circuit configuration could be used.

Circuit 13 of device 1 comprises three inputs 131, 132, and 133 respectively connected to output 153 of circuit 15a, to output 153 of circuit 15b, and to output 122 of circuit 12. Circuit 13 also comprises an input 134 receiving a control signal, and an output 135. Circuit 13 is configured to selectively couple, according to the control signal that it receives, one of inputs 131, 132, and 133 to output 135. Thus, the first delay line of circuit 14 (assembly of circuits 1135 of circuit 14) and the second delay line of circuit 14 (assembly of circuits 1136 of circuit 14) are selectively coupled to input 112 of circuit 11 by circuit 13.

Device 1 also comprises a control circuit 16 (CTRL). Circuit 16 comprises three outputs 161, 162, and 163 connected to the respective inputs 141, 142, and 134 of circuits 14 and 13. Circuit 16 is configured to deliver a binary signal either to input 141, or to input 142, which signal may possibly be identical and simultaneously sent to the two inputs 141 and 142. Circuit 16 is further configured to deliver the control signal to input 134 of circuit 13.

In an alternative embodiment, not shown, inputs 141 and 142 of circuit 14 are merged together, the outputs 161 and 162 of circuit 16 also being merged together.

In another variation, not shown outputs 153 of circuits 15a and 15b are coupled to a single input of circuit 13, via an OR logic function, for example, by an OR gate. In this case, circuit 16 is configured to deliver a signal to a first one of the two inputs 141 and 142, and then to the second one of the two inputs.

During a particle detection and characterization phase, or step, circuit 16 controls circuit 13 so that input 133 is coupled to output 135. When a particle hits circuit 10 and generates a voltage pulse therein, that is, here, a short passage in the high state of a binary signal normally in the low state, the pulse is transmitted to circuit 12, which lengthens by duration Tbd the duration Tpulse of the pulse. The pulse of lengthened duration is then supplied to input 112 of circuit 11, via circuit 13. A first corresponding pulse then propagates in the first delay line of circuit 11 (assembly of the circuits 1135 of circuit 11), a second corresponding pulse propagating in the second delay line of circuit 11 (assembly of the circuits 1136 of circuit 11). The first and second pulses have the same duration, here, Tpulse+Tbd, as the pulse received by circuit 11. Due to the fact that delay T1 is shorter than delay T2, at each stage 113a crossed by the first and second pulses, the second pulse is delayed by a duration T2−T1 with respect to the first pulse. For a given stage 113a, if the delay between the first and second pulses is such that the rising edge of the second pulse occurs while the first pulse is in the high state, the O output of flip-flop 1137 of this stage 113a is in the high state, that is, at "1". However, if the delay between the first and second pulses is such that the rising edge of the second pulse occurs while the falling edge of the first pulse has already occurred, the O output of the flip-flop 1137 of this stage 113a is in the low state, that is, "0". Thus, when a pulse of duration Tpulse+Tbd is supplied to input 112 of circuit 11, the number A of stages 113a having their flip-flop 1137 supplying an output at "1" is representative of the duration Tpulse+Tbd of the pulse, which duration is in the range from A*(T2−T1) to (A+1)*(T2−T1). Knowing the values of delays T1 and T2 and of duration Tbd, a range of values comprising duration Tpulse of the pulse generated in circuit 10 can thus be determined.

However, the real or practical values of delays T1 and T2 may be different from the known theoretical or design values of delays T1 and T2, particularly due to manufacturing dispersions of device 1. Device 1 enables to estimate, for each of delays T1 and T2, the practical or real value of the delay. Thereby, the duration of the pulse received by circuit 11 may be estimated with a greater accuracy than if only the theoretical values of delays T1 and T2 were used.

Figure 2:
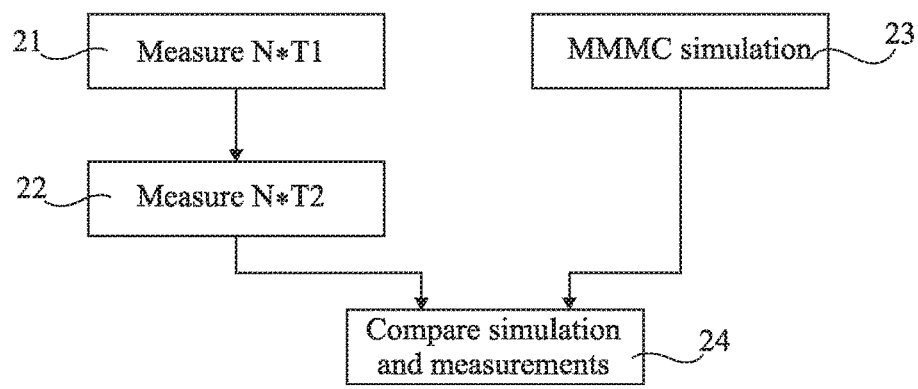
FIG. 2 shows in the form of blocks steps of an embodiment of a method of calibrating the device of FIG. 1.

FIG. 2 shows, in the form of blocks, steps of an embodiment of a method of calibration of the device of FIG. 1. More particularly, the method enables to estimate, after the manufacturing of device 1, the practical values of each of delays T1 and T2 of device 1.

At a step 21 (block "Measure N*T1"), circuit 16 controls circuit 13 so that it couples its input 131 to its output 134. Circuit 16 then switches, from the low state to the high state, the binary signal delivered to input 141 of circuit 14. As a result, output 153 of circuit 15a delivers a pulse of duration N*T1 (N being the number of stages 113b) which is transmitted, via circuit 13, to input 112 of circuit 11. Circuit 11 then delivers a digital signal or binary word OUT representative of duration N*T1 of the received pulse. At the end of step 21, circuit 16 switches, from the high state to the low state, the signal delivered to input 141 of circuit 14.

At a next step 22 (block "Measure N*T2"), the order of steps 21 and 22 being capable of being inverted, circuit 16 control circuit 13 so that the latter couples its input 132 to its output 134. Circuit 16 then switches, from the low state to the high state, the binary signal supplied to input 142 of circuit 14. As a result, output 153 of circuit 15b delivers a pulse of duration N*T2 which is transmitted, via circuit 13, to input 112 of circuit 11. Circuit 11 then delivers a digital signal or binary word OUT representative of duration N*T2 of the received pulse.

In parallel with steps 21 and 22, or possibly before or after one or the other of these steps, at a step 23 (block "MMMC simulation"), a multi-mode/multi-corner simulation, or MMMC simulation, of device 1 is performed. Step 23 is implemented outside of device 1, for example, by means of a computer, for example, controlled by an operator. The MMMC simulation enables to simulate device 1 by varying the values of a plurality of parameters, for example, the values of the manufacturing variations or dispersions, capable of modifying the time behavior of device 1, that is, the time characteristics of the logic gates forming it, for example, the rise time, the fall times, and/or the propagation times of the gates. The MMMC simulation further enables, for each set of values of the simulation parameters, to extract the corresponding time behavior of the simulated device 1. Thus, for each set of values of parameters of the simulation, the values of the binary words which would be obtained can be deduced by implementing steps 21 and 22 in a device 1 corresponding to this set of parameter values.

As an example, the MMMC simulation is performed by means of the simulation tool designated with name Incisive, sold by the firm called Cadence, or by the simulation tool designated with name Eldo, sold by the firm called Mentor. Such tools are based on the estimation, with worst cases and best cases, of parasitic elements introduced into device 1 resulting from the manufacturing, the placing of the cells and/or of the gates of device 1, the spacing of the metal conductive lines coupling the cells and/or the gates, the capacitance variations, the on-state resistance variations of the transistors forming the cells and/or the gates of device 1, etc. Such data relative to the parasitic elements of circuit 1 are extracted by tools such as the tool designated with name StarRC sold by the firm called Synopsis. The tool designated with name PrimeTime and sold by the firm called Synopsis also enables to perform time analyses and to extract propagation devices from each node of circuit 1.

At a step 24 (block "Compare simulation and measurements") subsequent to steps 21, 22, and 23, the values of the binary words OUT obtained during steps 21 and 22 are compared with the values of these binary words deduced during step 23. Step 24 is implemented outside of device 1, for example, by means of a computer, for example, controlled by an operator. Such a comparison enables to determine a set of parameter values of the MMMC simulation of step 23 resulting in a device 1 which would supply, at steps 21 and 22, values of binary words OUT corresponding to the values of binary words OUT obtained on implementation of steps 21 and 22 with the manufactured device 1. The time behavior of device 1 corresponding to this set of simulation parameter values provides an estimation of the time behavior of the manufactured device 1 which is used at steps 21 and 22. Based on such an estimation of the time behavior of device 1, the values of delays T1 and T2 of device 1 can be estimated.

At a next step (not illustrated) of detection and characterization of a particle by means of device 1, the values of delays T1 and T2 determined at step 24 are used to calculate a range of values comprising the duration Tpulse of a pulse generated in circuit 10. The range of values thus calculated is then more reliable than if it was determined from the theoretical values of delays T1 and T2. In other words, the error on the range of values comprising duration Tpulse of the pulse is smaller in the case where this range of values is determined with delay values T1 and T2 of step 24 than in the case where it would be determined with the theoretical values of the delays. This particularly results from the fact that the delay values T1 and T2 determined at step 24 take into account manufacturing dispersions.

An advantage of device 1 and of the above method is that it does not require using a measurement instrument external to device 1. Indeed, in the case of circuits 1135 and 1136 each formed of two series-connected inverters, it could have been devised to form a ring oscillator comprising inverters by looping back on itself each of the first and second delay lines of circuit 11. The values of delays T1 and T2 could then have been estimated by measuring, for example, by means of an oscilloscope external to device 1 but connected thereto, the period of each of the two oscillators thus formed. This would however imply providing additional connection terminals to connect the oscilloscope successively to each of the ring oscillators. Further, the measurement error introduced by the oscilloscope, by the operator manipulating the oscilloscope, and/or by the bandwidth limitations of the connection between device 1 and the oscilloscope would result in erroneous delay values T1, T2.

Figure 3:
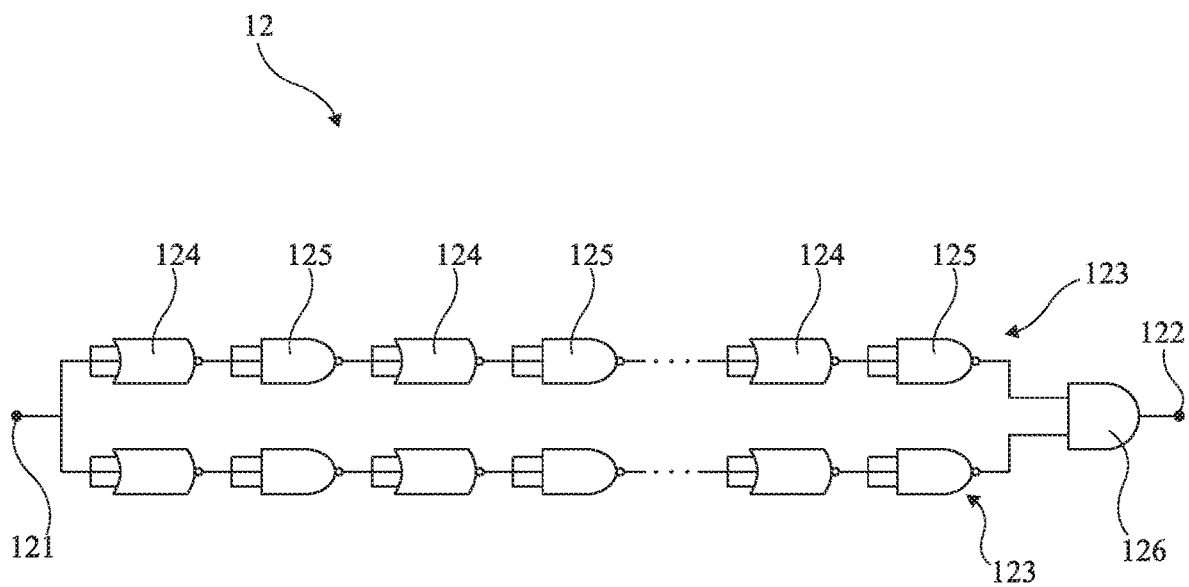
FIG. 3 shows an embodiment of a circuit of the device of FIG. 1, in more detailed fashion than in FIG. 1.

FIG. 3 shows an embodiment of circuit 12 of device 1, in more detailed fashion than in FIG. 1.

In this example, circuit 12 comprises two identical chains 123, each formed of an alternation of first and second logic gates, respectively 124 and 125. Gates 124 are identical to one another. Further, each gate 124 has a rise time greater than its fall time. Gates 125 are identical to one another. Each gate 125 has a rise time shorter than its fall time. Further, the first gates 124 and second gates 125 are selected so that a pulse supplied to input 121 of circuit 12 is propagated to output 122 of circuit 12. This is the difference between the rise and fall times of gates 124 and 125, and the number of gates 124, 125 per chain 123 which set the value of duration Tbd.

More particularly, in each chain 123, the inputs of the first gate in the chain, in this example a gate 124, are connected to input 121 of circuit 12, the output of the last gate in the chain, in this example a gate 125, is connected to a respective input of a two-input AND gate 126, and the output of each gate in the chain, except for the last gate, is connected to the inputs of the next gate in the chain. The output of AND gate 126 is connected to output 122 of circuit 12.

In the example of FIG. 3, the first gates 124 are three-input NOR logic gates and the second gates 125 are three-input NAND logic gates. As an example, each chain 123 comprises at least 10 gates 124, 125, for example, 20 gates 124, 125.

The provision of two chains 123 coupled to output 122 of circuit 12 via AND gate 126 enables to suppress a possible voltage pulse directly generated in one of chains 123, by a particle reaching chain 123. This also enables to decrease the impact, on the operation of circuit 12, of manufacturing variations between the two chains 123.

In a variation, not illustrated, circuit 12 comprises a single chain 123, gate 126 being omitted and the output of chain 123 being directly connected to the output. In this variation, a pulse directly generated in chain 123 will not be suppressed and will be perceived, by circuit 11, as a pulse originating from circuit 10. In other words, this will result in a poor characterization of the particle.

It will be within the abilities of those skilled in the art to design, based on the above functional indications, many alternative embodiments of circuit 12.

Figure 4A:
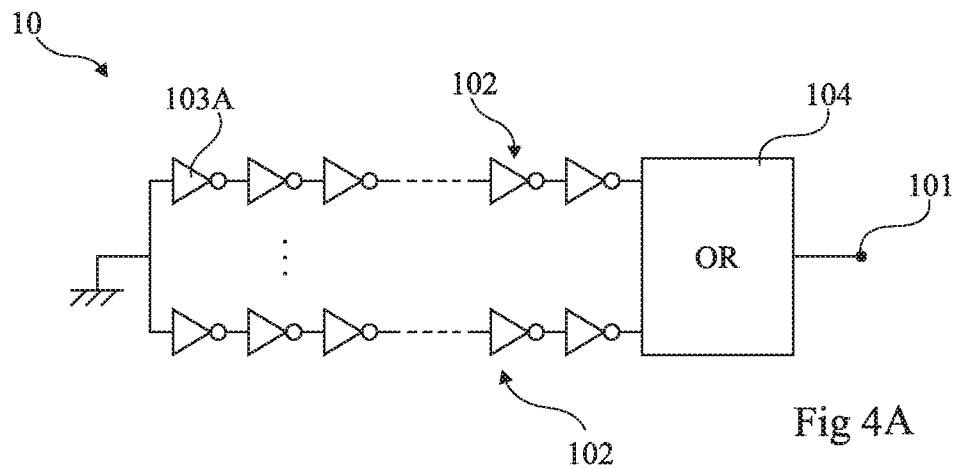
FIGS. 4A, 4B, and 4C show embodiments of another circuit of the device of FIG. 1, in more detailed fashion than in FIG. 1.
Figure 4B:
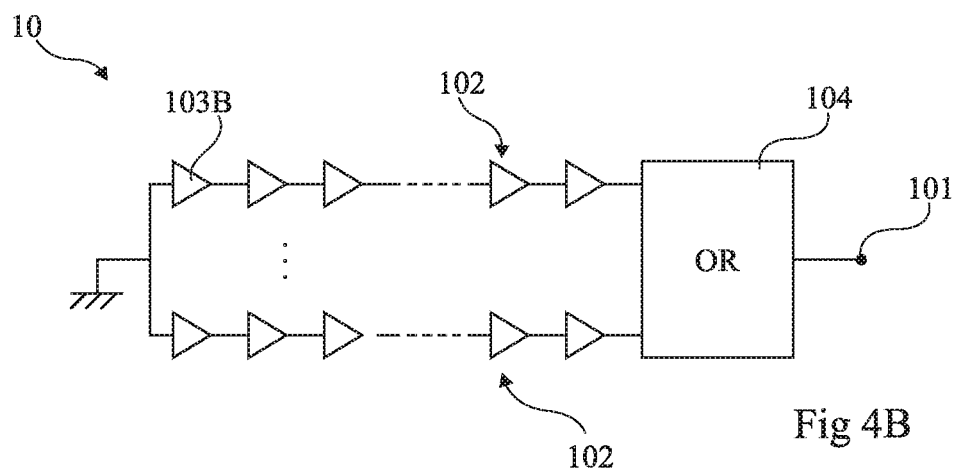
Figure 4C:
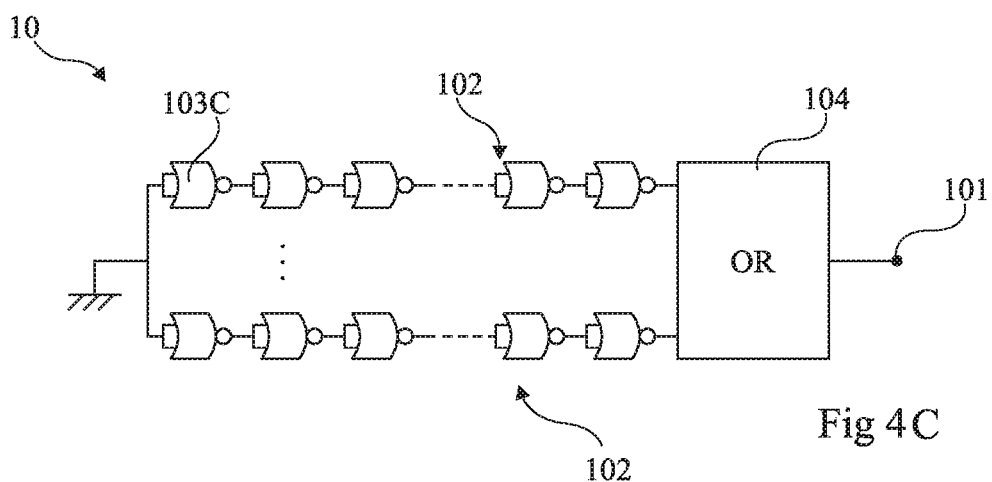

FIGS. 4A, 4B, and 4C show embodiments of circuit 10 of device 1, more detailed than in FIG. 1.

In each of the embodiments of FIGS. 4A, 4B, and 4C, circuit 10 comprises a plurality of identical chains 102, each formed of the series connection of a plurality of identical logic gates, respectively 103A, 103B, and 103C. The input of each chain 102 of circuit 10 receives a binary signal, here in the low state, for example, by being connected to ground as shown in FIG. 4. The output of each chain 102 of circuit 10 is connected to a corresponding input of a circuit 104 (OR). The output of circuit 104 is connected to output 101 of circuit 10 and delivers a binary signal corresponding to the logic OR of the binary signals present on its inputs. As an example, circuit 104 is an OR tree, preferably balanced, that is, each conductive path coupling an input of circuit 104 to output 101 of circuit 10, crosses a same number of identical OR gates.

Gates 103A, 103B, and 103C of chains 102 are selected so that, when a particle hits a chain 102 and generates a voltage pulse therein, the pulse is propagated to output 101 of circuit 10, with no or almost no modification of its duration. In other words, each gate 103A, 103B, and 103C has a rise time equal to its fall time. In the embodiments described in FIGS. 4A, 4B and 4C, gates 103A, 103B, and 103C are respectively inverters, buffers, and two-input NOR gates.

As an example, each chain 102 comprises at least 50 gates 103, for example, 100 gates 103. As an example, circuit 10 comprises at least 50 chains 102, preferably at least 100 chains 102, for example, 1,000 chains 102.

It will be within the abilities of those skilled in the art to design, based on the above functional indications, many alternative embodiments of circuit 10.

Figure 5:
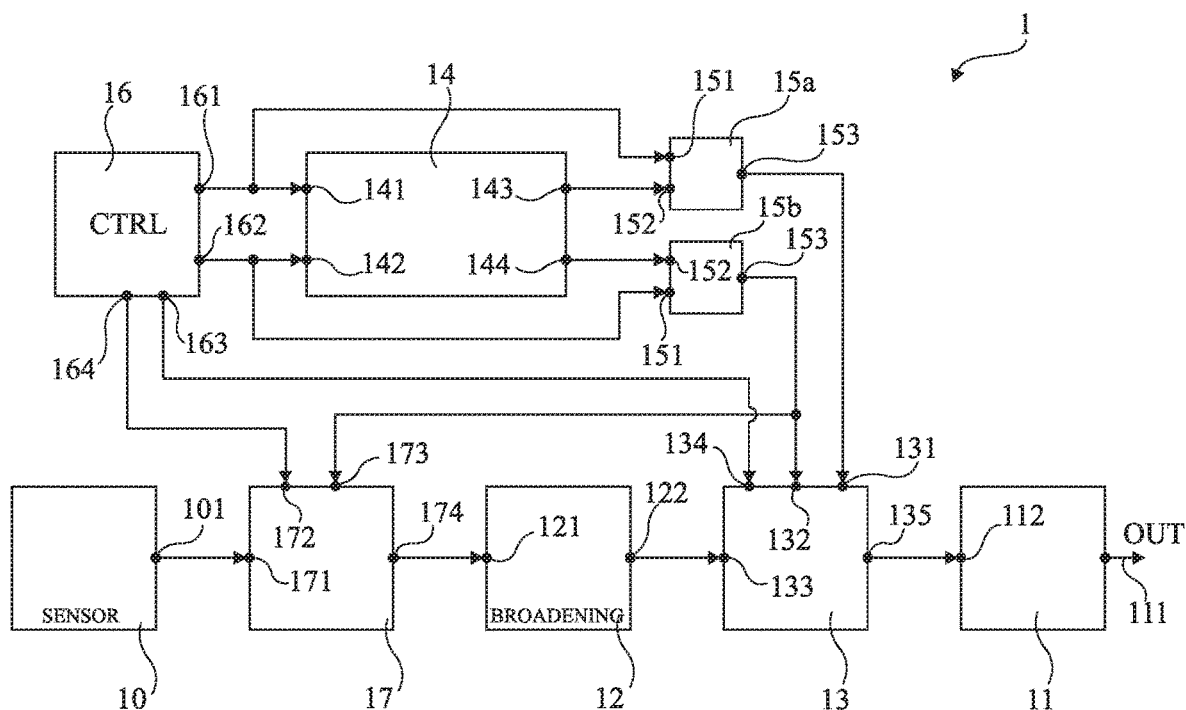
FIG. 5 schematically shows in the form of blocks of alternative embodiment of the device of FIG. 1.

FIG. 5 schematically shows in the form of blocks an alternative embodiment of device 1. Only the differences between the device 1 of FIG. 1 and the device 1 of FIG. 5 are detailed.

As compared with device 1 of FIG. 1, device 1 of FIG. 5 comprises an additional circuit 17 having an input 171 connected to output 101 of circuit 10 and having an output 174 connected to input 121 of circuit 12. In other words, output 101 of circuit 10 is not directly connected to input 121 of circuit 12. Circuit 17 further comprises an input 172 connected to an additional output 164 of circuit 16 to receive a control signal delivered by circuit 16. Circuit 17 also comprises an input 173 connected to the output 153 of one of circuits 15a and 15b, preferably that of circuits 15a and 15b delivering the longest pulse, here circuit 15b. Circuit 17 is configured to selectively couple, according to the control signal that it receives on its input 172, one of its inputs 171 and 173 to its output 174. Circuit 16 is further configured to deliver, during a particle detection and characterization step, a control signal to input 172 of circuit 17 so that circuit 17 then couples its input 171 to its output 174.

Figure 6:
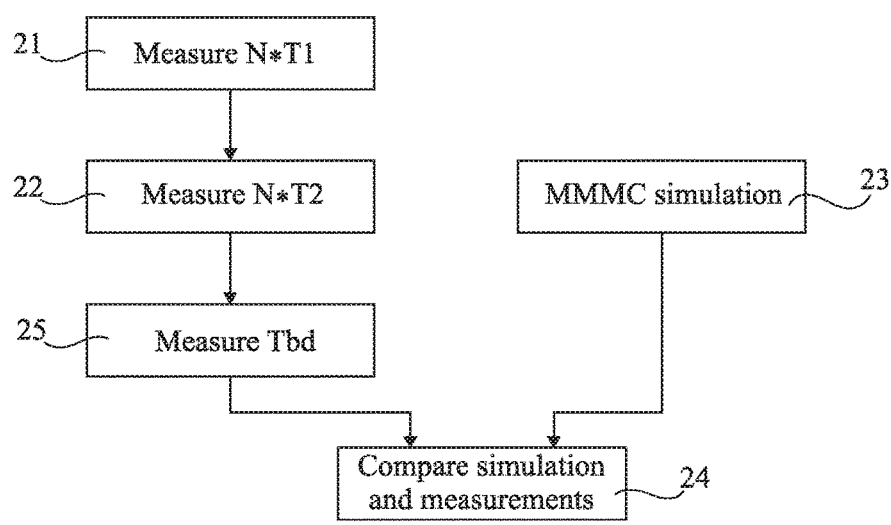
FIG. 6 shows in the form of blocks steps of an embodiment of a method of calibrating the device of FIG. 5.

FIG. 6 shows in the form of blocks steps of an embodiment of a method of calibrating device 1 of FIG. 5. More particularly, the device enables to estimate, after the manufacturing of device 1 of FIG. 5, the practical values of delays T1 and T2, and of duration Tbd of the manufactured device 1. Only the differences between the method of FIG. 6 and the method of FIG. 2 are detailed.

As compared with the method of FIG. 2, the method of FIG. 6 comprises an additional step 25. Step 25 is implemented before step 24, in this example, after steps 21 and 22, although the order of steps 21, 22, and 25 can be modified.

At step 25 ("Measure Tbd"), circuit 16 controls circuit 13 so that it couples its input 133 to its output 135, and circuit 17 so that it couples its input 173 to its output 174. Circuit 16 then switches, from the low state to the high state, the binary signal delivered to input 142 of circuit 14. As a result, output 153 of circuit 15b delivers a pulse of duration N*T2 which is transmitted, via circuit 17, to input 121 of circuit 12. Output 122 of circuit 12 thus delivers a pulse of duration N*T2+Tbd, which is transmitted to input 112 of circuit 11. Circuit 11 then delivers a digital signal or binary word OUT representative of duration N*T2+Tbd of the received pulse. It should be noted that in the case where input 173 of circuit 17 is connected to circuit 15a, the pulse delivered to input 173 of circuit 17 has a duration N*T1 and the corresponding pulse delivered to circuit 13 has a duration N*T1+Tbd.

Further, at step 23, based on the MMMC simulation of device 1 and similarly to what has been described in relation with FIG. 2, the values of binary words OUT which would be obtained by implementing steps 21, 22, and 25 in a device 1 corresponding to this set of simulation parameter values can be deduced.

At step 24 subsequent to steps 21, 22, 23, and 25, similarly to what has been described in relation with FIG. 2, the values of the binary words OUT obtained on implementation of steps 21, 22, and 25 by device 1 are compared with the values of these binary words deduced at step 23. Step 24 is implemented outside of device 1, for example, by means of a computer, for example, controlled by an operator. Such a comparison enables to determine a set of values of the parameters of the MMMC simulation of step 23 resulting in a device 1 which would deliver, at steps 21, 22, and 25, values of binary words OUT corresponding to the values of binary words OUT obtained on implementation of steps 21, 22, and 25 with the manufactured device 1. The time behavior of device 1 corresponding to this set of simulation parameter values supplies an estimation of the time behavior of the manufactured device 1 which is used at steps 21, 22, and 25. Based on this estimation of the time behavior of device 1, the values of delays T1 and T2 and of duration Tbd of device 1 used at steps 21, 22, and 25 can be estimated.

As described for delays T1 and T2 in relation with FIG. 2, the method of FIG. 6 provides an estimation of duration Tbd closest to the real or practical value of this duration than the theoretical or ideal value of this duration. Further, due to the fact that the method of FIG. 6 comprises additional step 25 with respect to the method of FIG. 2, the estimation of delays T1 and T2 with the method of FIG. 6 is more accurate than with the method of FIG. 2. Indeed, step 15 delivers a third value representative of the time behavior of the device 1 which is being characterized. In other words, step 25 delivers a third point of comparison between the real data delivered by the circuit 1 to be characterized and the data obtained by simulation. For example, if device 1 delivers two binary words OUT on implementation of steps 21 and 22, and if the MMMC simulation of step 23 provides at least two sets of simulation parameter values resulting in the obtaining of the two binary words OUT, step 25 provides a third binary word OUT which will enable to select the set of simulation parameters best representing the time behavior of the device 1 which is being characterized.

Thus, at a next particle detection and characterization step (not illustrated), the estimation of duration Tpulse of the particle is implemented by using the estimated values of durations T1, T2, and Tbd, determined at step 24. This enables to decrease the error on the range of values comprising duration Tpulse of the pulse with respect to the case where such a determination would be performed with a theoretical value of duration Tbd, particularly due to the fact that the estimated value of duration Tbd which is determined at step 24 takes into account manufacturing dispersions, in particular in circuit 12.

Figure 7:
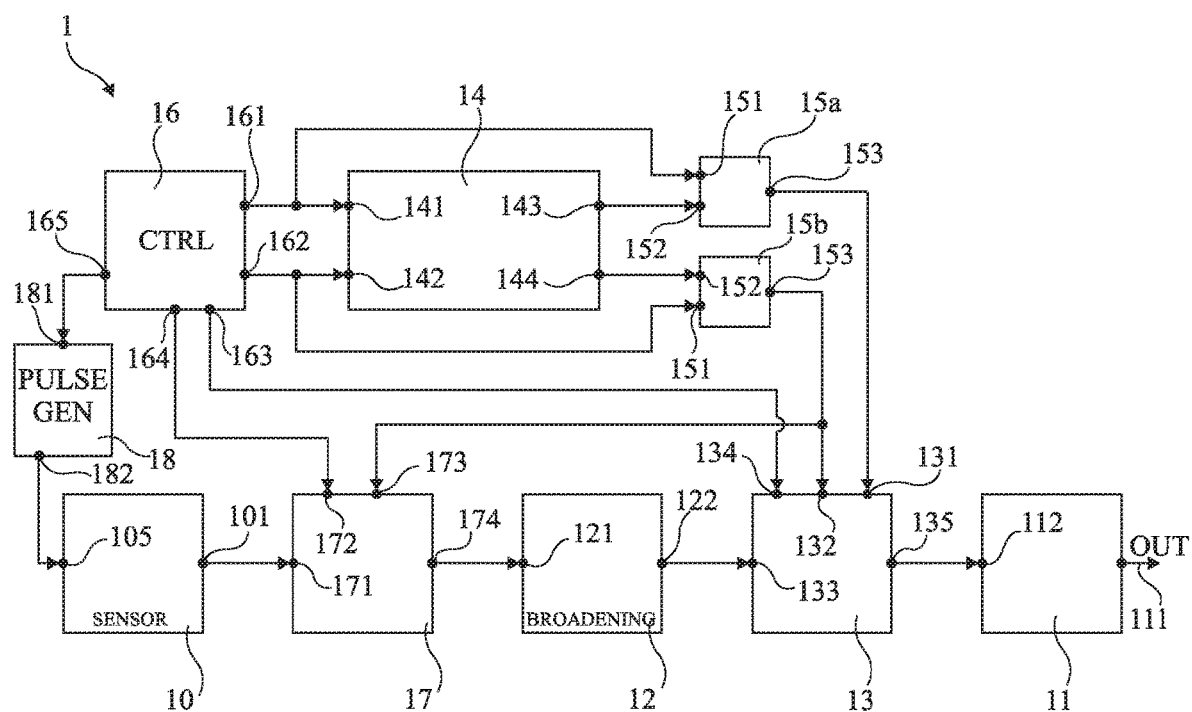
FIG. 7 schematically shows in the form of blocks another alternative embodiment of the device of FIG. 1.

FIG. 7 schematically shows in the form of blocks another alternative embodiment of device 1 of FIG. 1. Only the differences between device 1 of FIG. 5 and device 1 of FIG. 7 will be detailed.

In device 1 of FIG. 7, circuit 10 comprises an input 105, and at least one chain 102 of circuit 10 (FIG. 4), preferably a single chain 102, has its input connected to input 105 of circuit 10.

Further, as compared with device 1 of FIG. 5, device 1 of FIG. 7 comprises an additional circuit 18 (PULSE GEN). Circuit 18 comprises an input 181 connected to an additional output 165 of circuit 16 to receive a signal for controlling circuit 16. Circuit 18 further comprises an output 182 connected to input 105 of circuit 10 to deliver, when circuit 18 receives a corresponding control signal on its input 181, a pulse having a constant duration Tpulse to input 105 of circuit 10.

Figure 8:
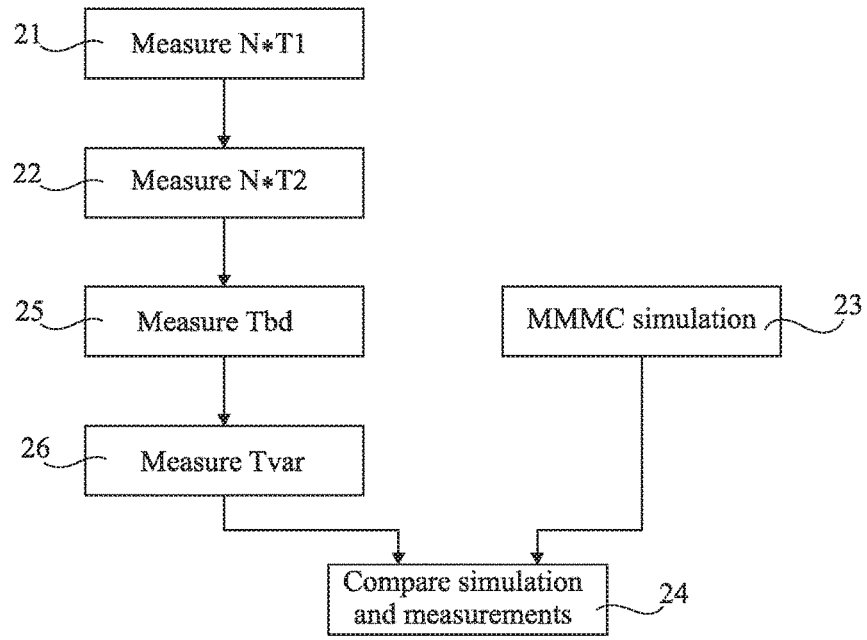
FIG. 8 shows in the form of blocks steps of an embodiment of a method of calibrating the device of FIG. 7.

FIG. 8 shows, in the form of blocks, steps of an embodiment of a method of calibrating the device 1 of FIG. 7. More particularly, the device enables to estimate, after the manufacturing of the device 1 of FIG. 7, the practical values of duration Tbd and of each of delays T1 and T2 of the manufactured device 1 as well as the time behavior of circuit 10. Only the differences between the method of FIG. 6 and the method of FIG. 8 are detailed.

As compared with the method of FIG. 6, the method of FIG. 8 comprises an additional step 26 (block "Measure Tvar"). Step 26 is implemented before step 24, in this example after steps 21, 22, and 25, although the order of steps 21, 22, 25, and 26 may be modified.

At step 26, circuit 16 controls circuit 13 so that it couples its input 133 to its output 135, and circuit 17 so that it couples its input 171 to its output 174. Circuit 16 then delivers a control signal to input 181 of circuit 18 so that output 182 of circuit 18 delivers a pulse of duration Tpulse to input 105 of circuit 10. The pulse successively propagates to output 101 of circuit 10, and then from input 171 to output 174 of circuit 17, and then from input 121 to output 122 of circuit 12, and eventually from input 133 to output 135 of circuit 13. As a result, circuit 11 receives a pulse of duration Tpulse+Tbd+Tvar and delivers a binary word OUT representative of this duration, Tvar representing a parasitic enlargement caused during the propagation of the pulse of duration Tpulse in chain 102 of circuit 10.

Further, at step 23, based on the MMMC simulation of device 1 and similarly to what has been described in relation with FIGS. 2 and 6, for each set of simulation parameter values, the values of binary words OUT which would be obtained by implementing steps 21, 22, 25, and 26 in a device 1 corresponding to this set of simulation parameter values can be deduced.

At step 24 subsequent to steps 21, 22, 23, 25, and 26, similarly to what has been described in relation with FIGS. 2 and 6, the values of the binary words OUT obtained on implementation of steps 21, 22, 25, and 26 are compared with the values of these binary words deduced at step 23. Step 24 is implemented outside of device 1, for example, by means of a computer, for example, controlled by an operator. Such a comparison enables to determine a set of values of the parameters of the MMMC simulation of step 23 resulting in a device 1 which would deliver values of binary words OUT corresponding to the values obtained on implementation of steps 21, 22, 25, and 26 with the manufactured device 1. The time behavior of device 1 corresponding to this set of simulation parameter values provides an estimate of the time behavior of the manufactured device 1 which is used at steps 21, 22, 25, and 26. Based on this estimate of the time behavior of device 1, the values of delays T1 and T2 and of duration Tbd of device 1 used at steps 21, 22, 25, and 26 as well as of duration Tvar can be estimated. The estimate of duration Tvar provides information relative to the time behavior of chain 102 (FIG. 4) of circuit 10 of device 1, and thus to the time behavior of circuit 10.

Thus, the provision of step 26 provides information relative to the time behavior of circuit 10, based on the estimated values T1, T2, and Tbd.

At a next particle detection and characterization step (not illustrated), the estimation of duration Tpulse generated by a particle in circuit 10 is implemented by using the estimated values of durations T1, T2, and Tbd which have been determined at step 24, and taking into account the estimate of the time behavior of circuit 10. This enables to decrease the error on the determination of the range of values comprising duration Tpulse of the pulse with respect to the case where such a determination would be performed after the implementation of the method of FIG. 6, particularly due to the fact that the method of FIG. 8 enables to estimate the time behavior of circuit 10 while taking into account manufacturing dispersions in device 1, and in particular in circuit 10.

FIG. 9 schematically shows in the form of blocks still another alternative embodiment of device 1 of FIG. 1. Only the differences between device 1 of FIG. 9 and device 1 of FIG. 7 are detailed.

Device 1 of FIG. 9 differs from that of FIG. 7 mainly in that it comprises at least two circuits 10. In this example, device 1 comprises three circuits 10, respectively designated with references 10A, 10B, and 10C. In FIG. 9, the inputs and outputs of circuits 10A, 10B, and 10C are designated with the references of the corresponding input and output of circuit 10 of FIG. 7, to which the respective letters A, B, and C have been appended.

Circuits 10A, 10B, and 10C are here different from one another, circuits 10A, 10B, and 10C for example corresponding to the respective embodiments A, B, and C described in relation with FIG. 4. As a variation, some at least of circuits 10A, 10B, and 10C may be identical.

Each of inputs 105A, 105B, and 105C of the respective circuits 10A, 10B, and 10C is connected to output 182.

Each of outputs 101A, 101B, and 101C is coupled to a corresponding input, respectively 1910A, 1910B, 1910C, of a circuit 191 of device 1. Circuit 191 comprises outputs 1911A, 1911B, and 1911C. Circuit 191 further comprises an input 1912 connected to an additional output 166 of circuit 16, to receive a signal for controlling circuit 16. According to the control signal received by its input 1912, circuit 191 is configured to selectively couple all the inputs 1910A, 1910B, and 1910C to the respective outputs 1911A, 1911B, and 1911C, or a single one of inputs 1910A, 1910B, and 1910C to the corresponding output 1911A, 1911B, or 1911C, this signal input being then determined by the received control signal.

Each of outputs 1911A, 1911B, and 1911C of circuit 191 is connected to a respective input 1921 of a circuit 192 (OR) of device 1. Circuit 192 is configured to perform an OR logic function or operation between the binary signals present on its inputs 1921, and to deliver the resulting binary signal on its output 1922. Output 1922 of circuit 192 is connected to input 171 of circuit 17.

Outputs 1911A, 1911B, and 1911C of circuit 191 are further coupled to respective inputs 1931A, 1931B, and 1931C of a circuit 193 of device 1. Circuit 193 comprises an output 1932 delivering an output signal OUT2 of device 1. When circuit 193 receives a pulse on one of its inputs 1931A, 1931B, 1931C, signal OUT2 is representative of the input having received the pulse. Preferably, circuit 193 comprises at least one flip-flop configured to capture a pulse present on one of inputs 1931A, 1931B, and 1931C, so that the state of signal OUT2 can be maintained for a plurality of cycles of a synchronization signal, for example, a clock signal. Signal OUT2 can thus be more easily read by a device external to circuit 1.

More particularly, in the example of FIG. 9, outputs 1911A, 1911B, and 1911C are coupled to respective inputs 1931A, 1931B, and 1931C via circuits, respectively 194A, 194B, and 194C. Circuits 194A, 194B, and 194C are preferably identical. Each circuit 194A, 194B, and 194C is configured to lengthen the duration of a pulse received on its input, respectively 1941A, 1941B, and 1941C, the pulse of lengthened duration being then available on its output, respectively 1942A, 1942B, and 1942C. Outputs 1942A, 1942B, and 1942C are connected to the respective inputs 1931A, 1931B, and 1931C of circuit 193. The provision of circuits 194A, 194B, and 194C enables circuit 193 to more easily detect the pulses that it receives. As an example, each circuit 194A, 194B, and 194C is identical to circuit 12.

In an alternative embodiment, not illustrated, outputs 1911A, 1911B, and 1911C may be directly connected to the respective inputs 1931A, 1931B, and 1931C, circuits 194A, 194B, and 194C then being omitted. However, similarly to what has been indicated for the alternative embodiments where circuit 12 is omitted, the omitting of circuits 194A, 194B, and 194C may result in that the pulses delivered to circuit 193 are too short to be properly detected, for example, by flip-flops of circuit 193.

During a particle detection and characterization phase, circuit 16 controls circuit 18 so that it generates no pulse. Circuit 16 also controls circuit 191 so that each input 1910A, 1910B, and 1910C is coupled to the respective output 1911A, 1911B, and 1911C. Thus, when a particle hits one of circuits 10A, 10B, and 10C, for example, circuit 10A, and generates a pulse therein, the pulse is propagated to input 171 of circuit 17, so that it can then be measured by circuit 11 similarly to what has been previously described. The pulse generated in circuit 10A is also propagated to input 1931A of circuit 193, in this example via circuit 194A which lengthens the duration of the pulse, and signal OUT2 delivered by circuit 193 enables to know that the pulse has been generated in circuit 10A, and thus that the particle having generated the pulse has hit circuit 10A.

Further, in device 1 of FIG. 9, step 26 of the method described in relation with FIG. 8 may be implemented successively for each of circuits 10A, 10B, and 10C or for at least some of circuits 10A, 10B, and 10C, steps 24 being accordingly adapted.

As an example, the case where step 26 is implemented for circuit 10A is considered. In this case, at step 26, circuit 16 controls circuit 191 so that input 1910A is coupled to output 1911A, while inputs 1910B and 1910C are not coupled to respective outputs 1911B and 1911C. It will be within the abilities of those skilled in the art, based on this example, to implement step 26 for each of circuits 10B and 10C.

Although FIG. 9 shows separate circuits 191 and 193, it will be within the abilities of those skilled in the art, based on the functional indications given hereabove, to design a single circuit implementing the functions of the two circuits 191 and 193.

Further, in the example of FIG. 9, rather than providing a circuit 191 connected to the outputs of circuits 10, a circuit connected between output 182 of circuit 18 and the inputs of circuits 10 may be provided, the circuit being controlled to transmit the pulse that it receives to a single one of circuits 10, determined by a signal for controlling circuit 16.

It may also be provided for circuit 17 to comprise no input 172, and for circuit 191 to be configured to selectively simultaneously connect its inputs 1910A, 1910B, and 1910C to its respective outputs 1911A, 1911B, and 1911C (detection phase), to only connect one of its inputs 1910A, 1910B, and 1910C to the respective output 1911A, 1911B, or 1911C (step 26), or to connect none of its inputs 1910A, 1910B, and 1910C to its respective outputs 1911A, 1911B, and 1911C (step 21, 22, or 23). In this case, circuit 172 may be a simple OR function, for example, a two-input OR gate, circuit 16 being configured to provide no signal to inputs 141 or 142 of circuit 14 on implementation of step 26 or of a detection step.

It will be within the abilities of those skilled in the art to adapt device 1 of FIG. 9 and the method associated therewith to any number of circuits 10, greater than or equal to 2.

Further, similarly to device 1 of FIG. 9, a plurality of circuits 10 may be provided in device 1 of FIGS. 1 and 5. In device 1 of FIG. 1, a circuit 192 is then arranged between outputs 101 of circuits 10, and input 121 of circuit 12. In device 1 of FIG. 5, a circuit 192 is then arranged between outputs 101 of circuits 10, and input 171 of circuit 17. In these two cases, circuit 191 is omitted, circuits 194 and 193 being optional and directly connected to outputs 101 of circuits 10.

Further, although a circuit 16 delivering a plurality of control signals has been described in relation with FIGS. 5, 7, and 9, circuit 16 may provide a single control signal representative of all the previously-described control signals, the single control signal being then delivered to each circuit controlled by circuit 16.

In the embodiments and variations which have been described, the provision of stages 113b identical to stages 113a enables the electrical and time behavior of stages 113b to be as close as possible to that of stages 113a. In an unclaimed alternative embodiment, it may be provided for stages 113b to comprise no flip-flop 1137. In this case, the electrical and time behavior of stages 113b will be more remote from that of stages 113a but will still enable to estimate the values of durations T1, T2, and Tbd at the cost of a decreased accuracy with respect to the embodiments where each stage 113b comprises a flip-flop 1137.

Various embodiments and variations have been described. It will be understood by those skilled in the art that certain features of these various embodiments and variations may be combined, and other variations will occur to those skilled in the art. In particular, the method of FIG. 2 may be implemented by using the devices 1 described in relation with FIGS. 5, 7, and 9 and the method of FIG. 6 may be implemented by using the devices described in relation with FIGS. 7 and 9.

Finally, the practical implementation of the described embodiments and variations is within the abilities of those skilled in the art based on the functional indications given hereabove. In particular, the practical implementation of circuits 13, 17, 192, 193, and 101 is within the abilities of those skilled in the art based on the functional indications given hereabove. Further, the number of stages of circuit 14 may be selected by those skilled in the art while however ascertaining that number N of stages of circuit 14 respects inequalities N*T1<M*(T2−T1) and N*T2<M*(T2−T1), M being the number of stages 113a of circuit 11. Thus, the duration of a pulse supplied by circuit 15a or 15b to circuit 11 may be measured by circuit 11, M*(T2−T1) representing the maximum duration of a pulse that circuit 11 can measure.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device, comprising:
   a first circuit providing a Vernier delay line circuit that comprises a first chain of identical stages defining first and second delay lines both coupled to a first input;
   a second circuit comprising a second chain of identical stages defining third and fourth delay lines, wherein the identical stages of the second chain are identical to the identical stages of the first chain; and
   a third circuit configured to selectively couple a selected one of an output of the third delay line, an output of the fourth delay line, or a first input of the third circuit to said first input of the first circuit,
   wherein said first circuit is configured to generate a digital signal representative of a duration of a pulse received by said first input of the first circuit.

2. The device of claim 1, wherein a number of identical stages in the second chain is smaller than a number of identical stages in the first chain.

3. The device of claim 1, wherein the digital signal is a binary word representative of the duration of the pulse.

4. The device of claim 1, further comprising:
   a fourth circuit connected to the output of the third delay line and configured to deliver to a second input of the third circuit a first pulse having a duration representative of a delay introduced by the third delay line; and
   a fifth circuit connected to the output of the fourth delay line and configured to deliver to a third input of the third circuit a second pulse having a duration representative of a delay introduced by the fourth delay line; and
   wherein the third circuit is configured to selectively deliver a selected one of the first pulse, the second pulse, or a pulse received by the first input of the third circuit to said first input of the first circuit in response to a control signal received by a fourth input of the third circuit.

5. The device of claim 4, further comprising a sixth circuit having an output connected to the first input of the third circuit and having an input configured to receive a pulse and deliver a pulse at the output which is longer by a given duration than the pulse received at the input.

6. The device of claim 5, further comprising a seventh circuit configured to selectively deliver, to the input of the sixth circuit, a selected one of the first and second pulses or a pulse received on a first input of the seventh circuit, according to a control signal received by a second input of the seventh circuit.

7. The device of claim 6, further comprising an eighth circuit configured to propagate a pulse all the way to an output of the eighth circuit, the output of the eighth circuit being coupled to the first input of the seventh circuit.

8. The device of claim 7, further comprising a ninth circuit having an output coupled to an input of said eighth circuit, the ninth circuit being configured to deliver at its output a same pulse each time an input of the eighth circuit receives a corresponding control signal.

9. The device of claim 8, comprising at least two eighth circuits.

10. The device of claim 9, comprising:
    a tenth circuit configured to selectively couple, according to a control signal received by an input of the tenth circuit, the output of the ninth circuit to the input of the at least two eighth circuits; and an eleventh circuit configured to deliver, to the first input of the seventh circuit, a signal corresponding to the logic OR of outputs from said at least two eighth circuits.

11. The device of claim 10, further comprising a twelfth circuit configured to deliver a signal indicating which eighth circuit of said at least two eighth circuits originates a pulse that is received by the first input of the seventh circuit.

12. The device of claim 10, further comprising a control circuit configured to deliver an input signal to the third delay line and to the fourth delay line.

13. The device of claim 12, wherein the control circuit is further configured to deliver one or more of: the signal for controlling the third circuit, the signal for controlling the seventh circuit, the signal for controlling the ninth circuit and the signal for controlling the tenth circuit.

14. The device of claim 9, comprising:
a tenth circuit configured to selectively couple, according to a control signal received by an input of the tenth circuit, an output of each eighth circuit to an output of a corresponding tenth circuit; and
an eleventh circuit configured to deliver, to the first input of the seventh circuit, a signal corresponding to the logic OR of the outputs of the tenth circuit.

15. The device of claim 14, further comprising a twelfth circuit configured to deliver a signal indicating which eighth circuits originates a pulse received by the first input of the seventh circuit.

16. The device of claim 14, further comprising a control circuit configured to deliver an input signal to the third delay line and to the fourth delay line.

17. The device of claim 16, wherein the control circuit is further configured to deliver one or more of: the signal for controlling the third circuit, the signal for controlling the seventh circuit, the signal for controlling the ninth circuit and the signal for controlling the tenth circuit.

18. The device of claim 1, wherein each stage in the first chain introduces a first delay on the first delay line and a second delay on the second delay line, and wherein each stage in the second chain introduces the first delay on the third delay line and the second delay on the fourth delay line, the second delay being greater than the first delay.

19. The device of claim 18, wherein each stage comprises:
a synchronous flip-flop;
a fourth circuit coupling a first input of the stage to a first output of the stage and to a data input of the synchronous flip-flop, the fourth circuit being configured to propagate a signal with the first delay; and
a fifth circuit coupling a second input of the stage to a second output of the stage and to a synchronization input of the synchronous flip-flop, the fifth circuit being configured to propagate a signal with the second delay.

20. The device of claim 1, further comprising a control circuit configured to deliver an input signal to the third delay line and to the fourth delay line.

* * * * *